(12) United States Patent
Jang et al.

(10) Patent No.: US 11,955,467 B2
(45) Date of Patent: Apr. 9, 2024

(54) SEMICONDUCTOR DEVICE AND METHOD OF FORMING VERTICAL INTERCONNECT STRUCTURE FOR POP MODULE

(71) Applicant: STATS ChipPAC Pte. Ltd., Singapore (SG)

(72) Inventors: Junghwan Jang, Incheon (KR); Giwoong Nam, Incheon (KR); Myongsuk Kang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 222 days.

(21) Appl. No.: 17/347,065

(22) Filed: Jun. 14, 2021

(65) Prior Publication Data

US 2022/0399315 A1    Dec. 15, 2022

(51) Int. Cl.
*H01L 25/10*    (2006.01)
*H01L 21/48*    (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
CPC ... H01L 25/105; H01L 25/0657; H01L 25/03; H01L 25/50; H01L 21/56; H01L 21/561; H01L 21/4853; H01L 21/4857; H01L 21/565; H01L 21/568; H01L 21/6835; H01L 23/49816; H01L 23/5385; H01L 23/3128; H01L 23/5383; H01L 23/5386; H01L 23/5389; H01L 24/19; H01L 24/20; H01L 2221/68345; H01L 2221/68359; H01L 2221/68372; H01L 2224/214; H01L 2224/81005; H01L 2225/06548; H01L 2225/06568; H01L 2225/06524;
(Continued)

(56) References Cited

U.S. PATENT DOCUMENTS 8,003,445 B2    8/2011    Pagaila et al.
9,236,352 B2    1/2016    Pagaila et al.
(Continued)

*Primary Examiner* — Kyoung Lee
*Assistant Examiner* — Christina A Sylvia
(74) *Attorney, Agent, or Firm* — Robert D. Atkins; PATENT LAW GROUP: Atkins and Associates, P.C.

(57) ABSTRACT

A semiconductor device has a substrate and a first light sensitive material formed over the substrate. A plurality of first conductive posts is formed over the substrate by patterning the first light sensitive material and filling the pattern with a conductive material. A plurality of electrical contacts is formed over the substrate and the conductive posts are formed over the electrical contacts. A first electric component is disposed over the substrate between the first conductive posts. A plurality of second conductive posts is formed over the first electrical component by patterning a second light sensitive material and filling the pattern with conductive material. A first encapsulant is deposited over the first electrical component and conductive posts. A portion of the first encapsulant is removed to expose the first conductive posts. A second electrical component is disposed over the first electrical component and covered with a second encapsulant.

23 Claims, 12 Drawing Sheets

(51) Int. Cl.
  *H01L 21/56* (2006.01)
  *H01L 21/683* (2006.01)
  *H01L 23/00* (2006.01)
  *H01L 23/31* (2006.01)
  *H01L 23/538* (2006.01)
  *H01L 25/00* (2006.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/50* (2013.01); *H01L 2221/68372* (2013.01); *H01L 2224/214* (2013.01); *H01L 2225/1035* (2013.01); *H01L 2225/1058* (2013.01)

(58) Field of Classification Search
  CPC ... H01L 2225/06586; H01L 2225/1035; H01L 2225/1058; H01L 2225/06582; H01L 2225/06513
  See application file for complete search history.

(56) References Cited

U.S. PATENT DOCUMENTS

| | | | |
|---|---|---|---|
| 10,068,862 | B2 | 9/2018 | Do et al. |
| 10,304,817 | B2 | 5/2019 | Lin et al. |
| 2009/0283870 | A1* | 11/2009 | Pagaila .................. H01L 24/19 438/109 |
| 2011/0014746 | A1 | 1/2011 | Do et al. |
| 2015/0179570 | A1* | 6/2015 | Marimuthu ............. H01L 24/97 438/126 |
| 2018/0076142 | A1* | 3/2018 | Shim ..................... H01L 25/105 |
| 2018/0122764 | A1* | 5/2018 | Chen ...................... H01L 24/01 |

* cited by examiner

SEMICONDUCTOR DEVICE AND METHOD OF FORMING VERTICAL INTERCONNECT STRUCTURE FOR POP MODULE

FIELD OF THE INVENTION

The present invention relates in general to semiconductor devices and, more particularly, to a semiconductor device and method of forming a vertical interconnect structure without etching, drilling, or laser direct ablation (LDA) in a package on package (PoP) module.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Most 3D wafer-level semiconductor packages, including stacked packages or package on package (PoP), use through silicon vias (TSV) and through mold vias (TMV) for vertical electrical interconnect. For example, a conductive post is formed through the silicon or encapsulant to electrically connect to the top package or top semiconductor die. The steps of forming TSV and TMV typically involve laser drilling or other etching process to form vias or openings through the silicon or encapsulant. The vias are then filled with conductive material to form the vertical conductive TSV and TMV. Conventional via formation using laser drilling or other etching process adds costs to the manufacturing process due to the specialized equipment and number of additional steps.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
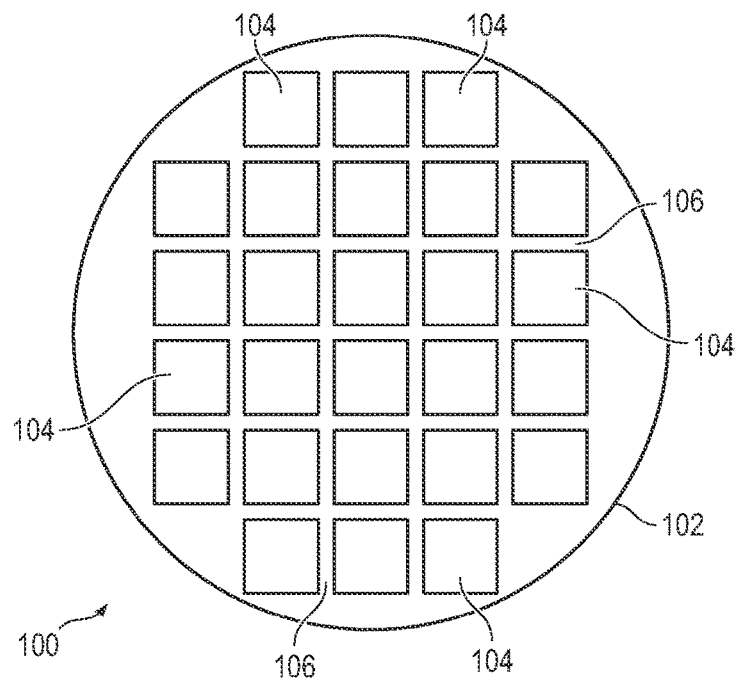
FIGS. 1a-1f illustrate a semiconductor wafer with a plurality of semiconductor die with conductive pillars.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
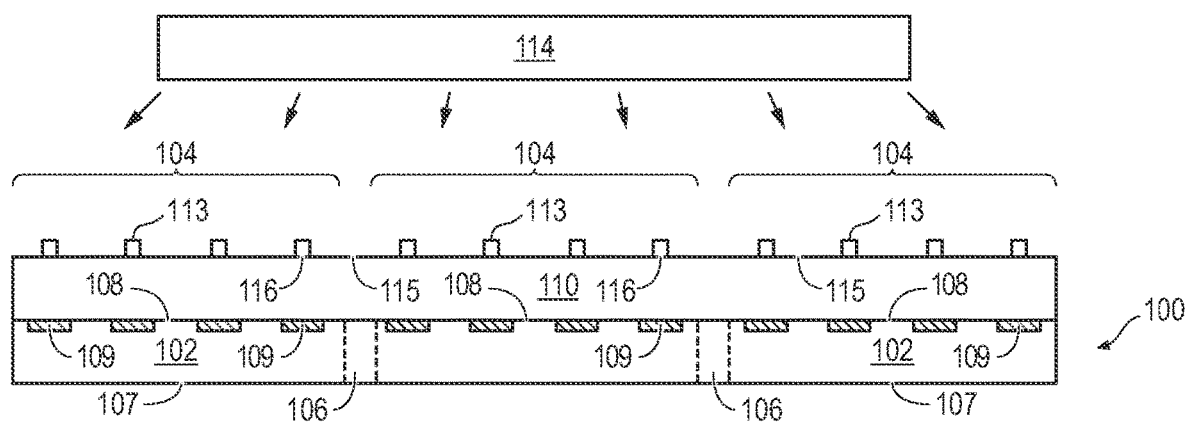

FIG. 1B shows a cross-sectional view of a portion of semiconductor wafer 100. Each semiconductor die 104 has a back or non-active surface 107 and an active surface 108 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 108 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 109 is formed over active surface 108 using PVD, CVD, electrolytic plating, electroless plating process, or other suitable metal deposition process. Conductive layer 109 can be one or more layers of aluminum (Al), copper (Cu), titanium (Ti), tin (Sn), nickel (Ni), gold (Au), silver (Ag), or other suitable electrically conductive material. Conductive layer 109 operates as contact pads electrically connected to the circuits on active surface 108.

Figure 1C:
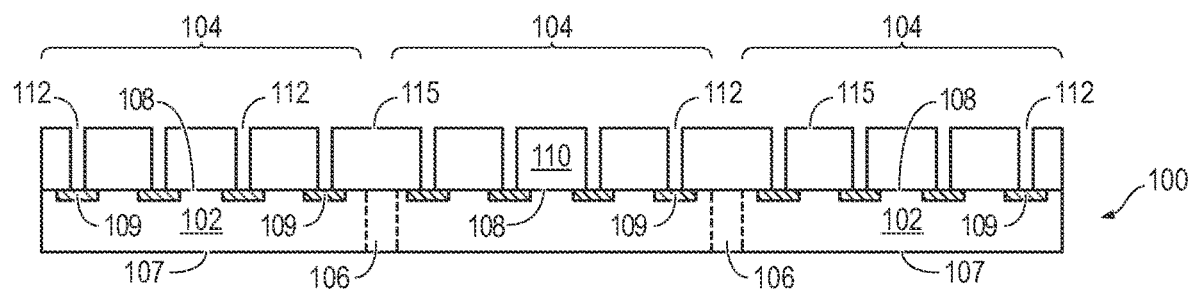

A light sensitive material 110 is deposited over active surface 108 and conductive layer 109. In one embodiment, light sensitive material 110 is a photoresist layer. Photoresist layer 110 is patterned to form vias or openings 112. In one embodiment, mask 113 is disposed over photoresist layer 110. Mask 113 and the exposed areas of photoresist layer 110 are subjected to ultraviolet light 114. Areas 115 of photoresist layer 110 exposed to the UV light harden, while areas 116 under mask 113 remain soluble. In FIG. 1c, mask 113 is removed and the soluble areas 116 of photoresist layer 110 are rinsed away leaving vias 112. Vias 112 are thus formed without etching, drilling, or laser direct ablation (LDA). Vias 112 are aligned with and extend to conductive layer 109.

Figure 1D:
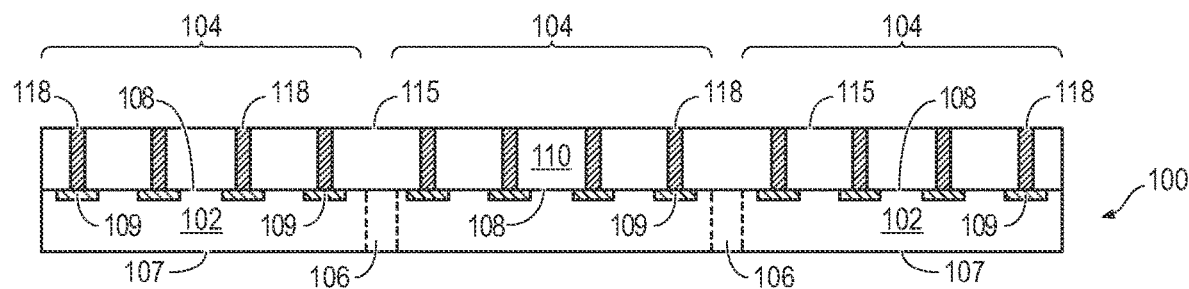
Figure 1E:
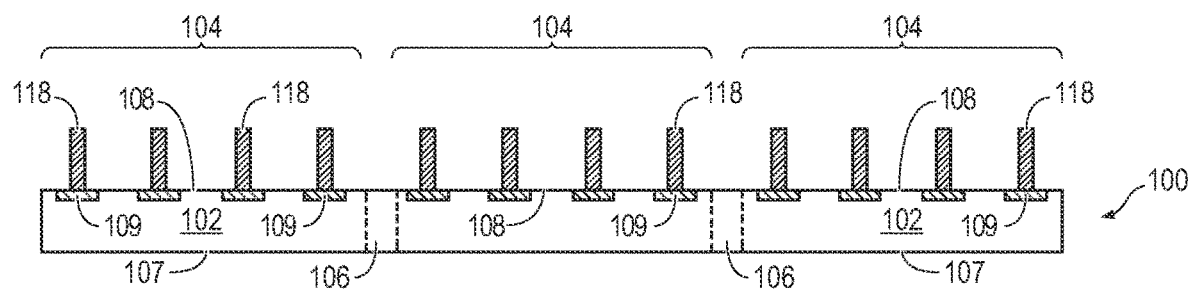

In FIG. 1d, vias 112 are filled with a conductive material to form conductive posts 118 over conductive layer 109. In one embodiment, conductive posts 118 are formed over conductive layer 109 using PVD, CVD, electrolytic plating, electroless plating process, or other suitable metal deposition process. In FIG. 1e, photoresist layer 110 is removed leaving conductive posts 118.

Figure 1F:
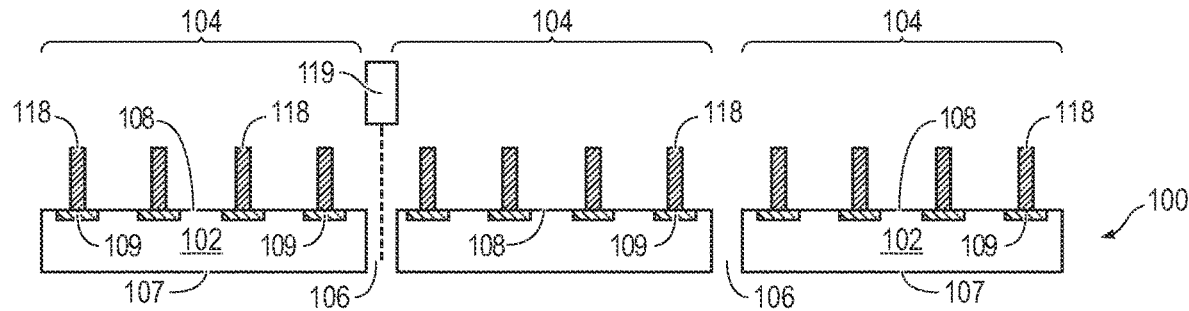

In FIG. 1f, semiconductor wafer 100 is singulated through saw street 106 using saw blade or cutting tool 119 into individual semiconductor die 104. The individual semiconductor die 104 can be inspected and electrically tested for identification of KGD post singulation.

Figure 2A:
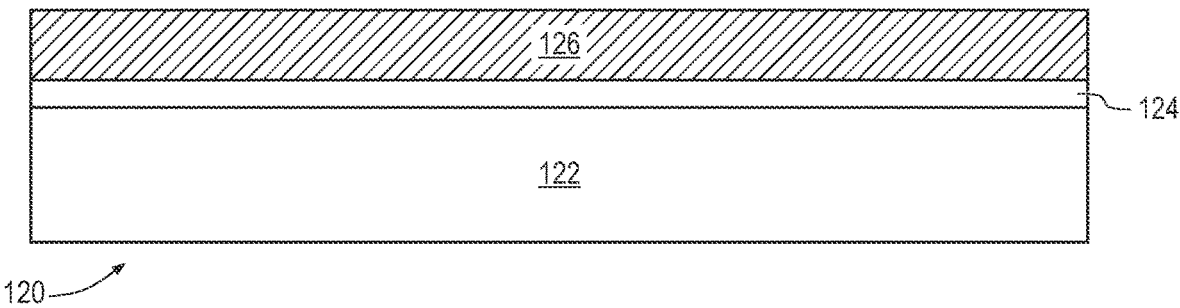
FIGS. 2a-2s illustrate a process of forming a vertical interconnect structure without etching, drilling, or LDA in a PoP module.
Figure 2B:
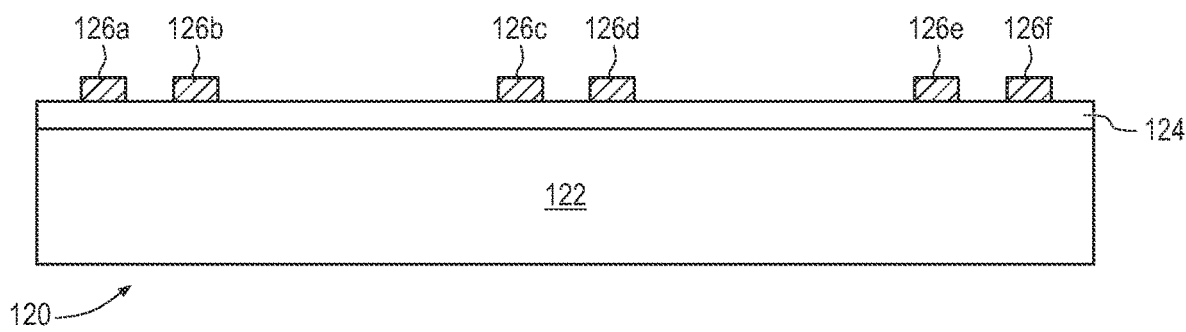
Figure 2C:
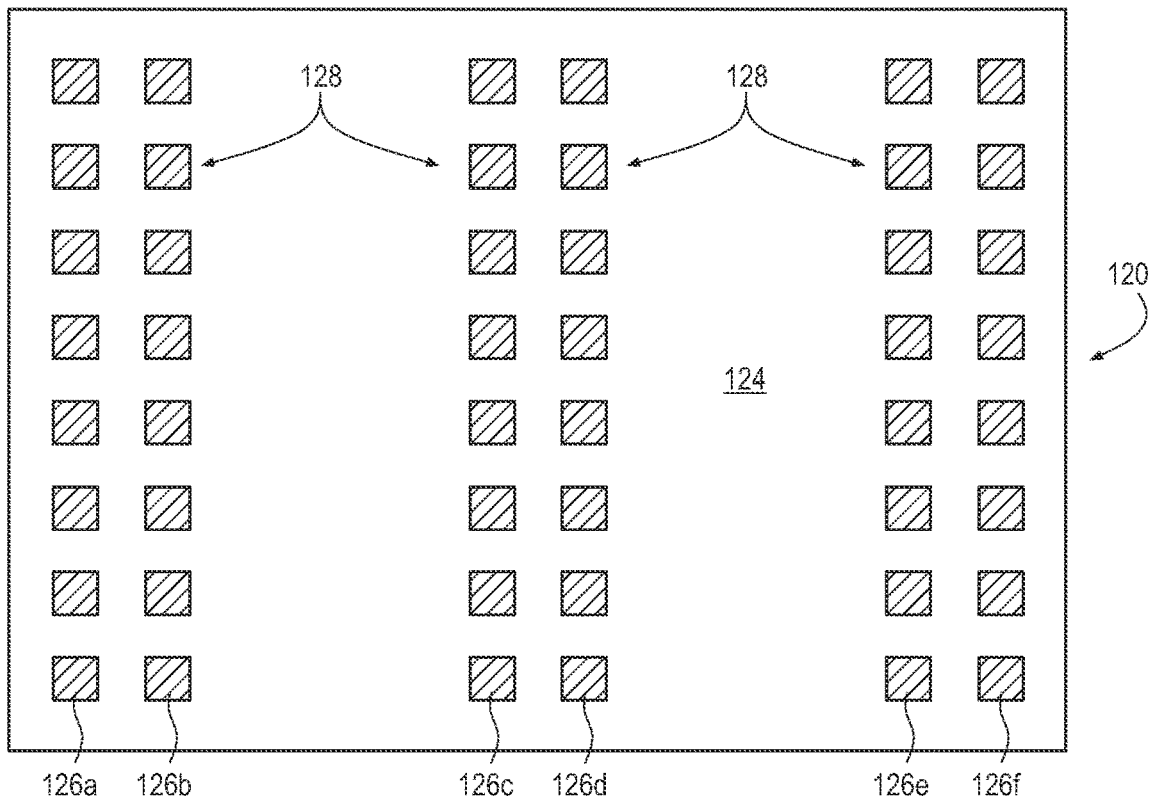
Figure 2D:
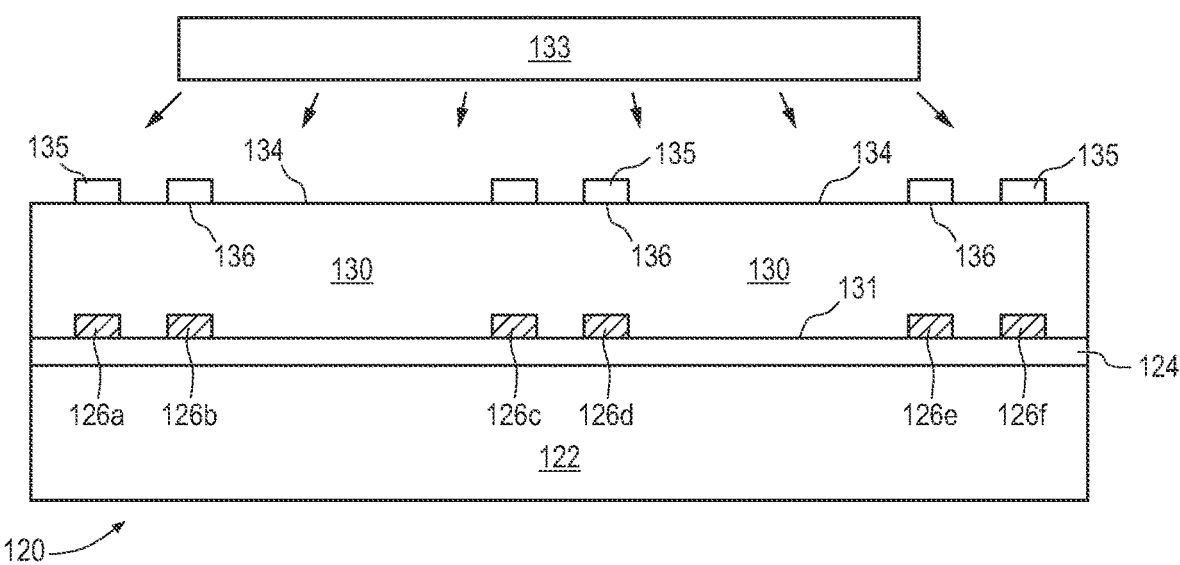
Figure 2E:
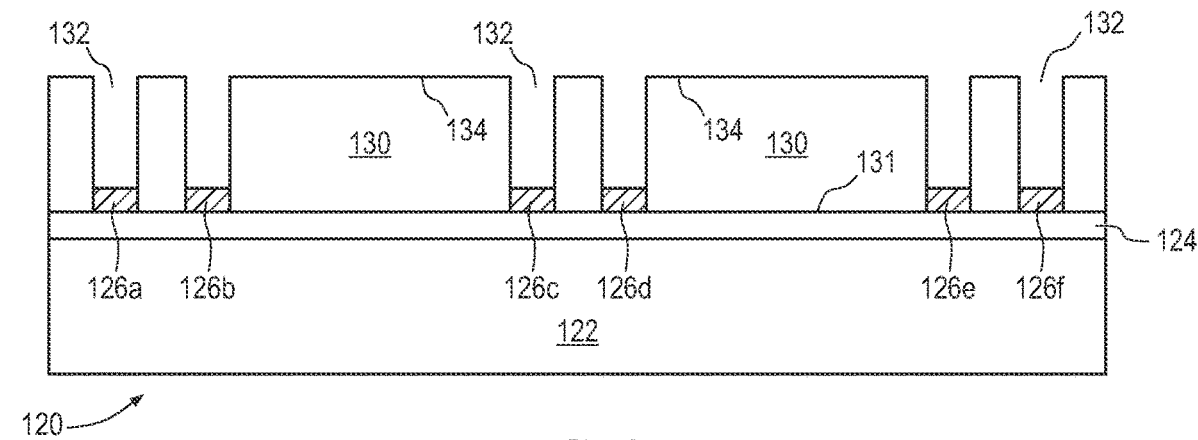
Figure 2F:
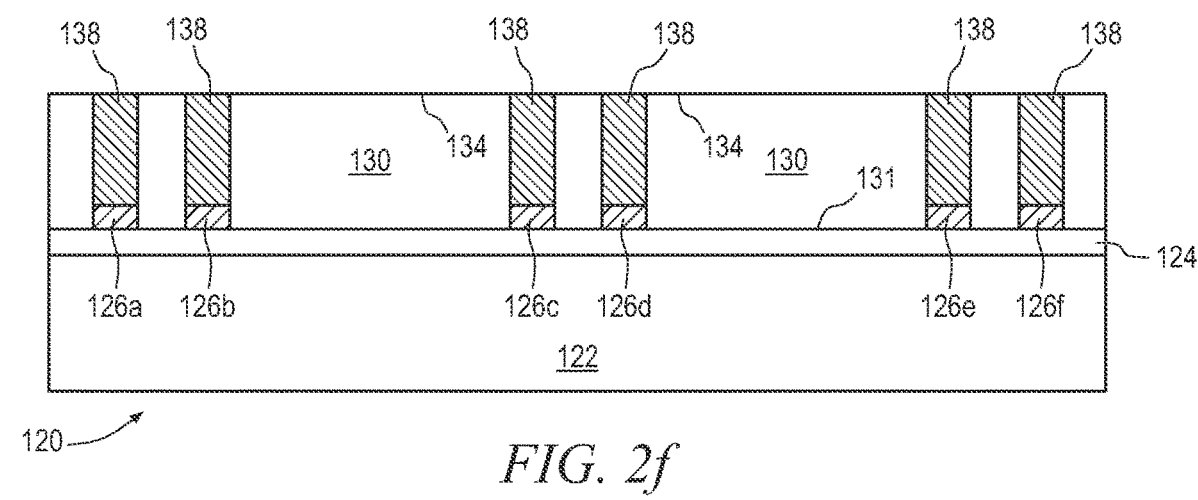
Figure 2G:
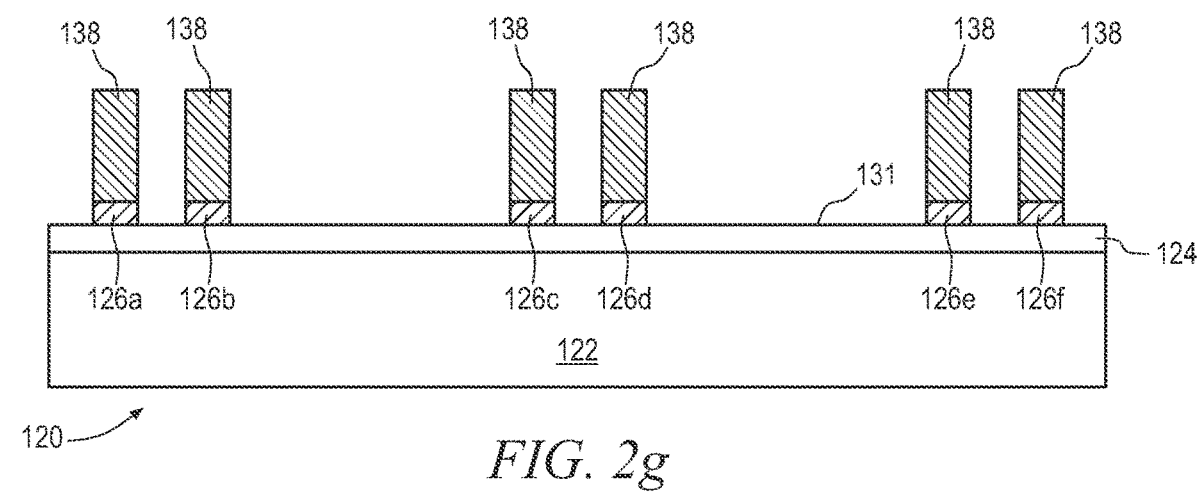
Figure 2H:
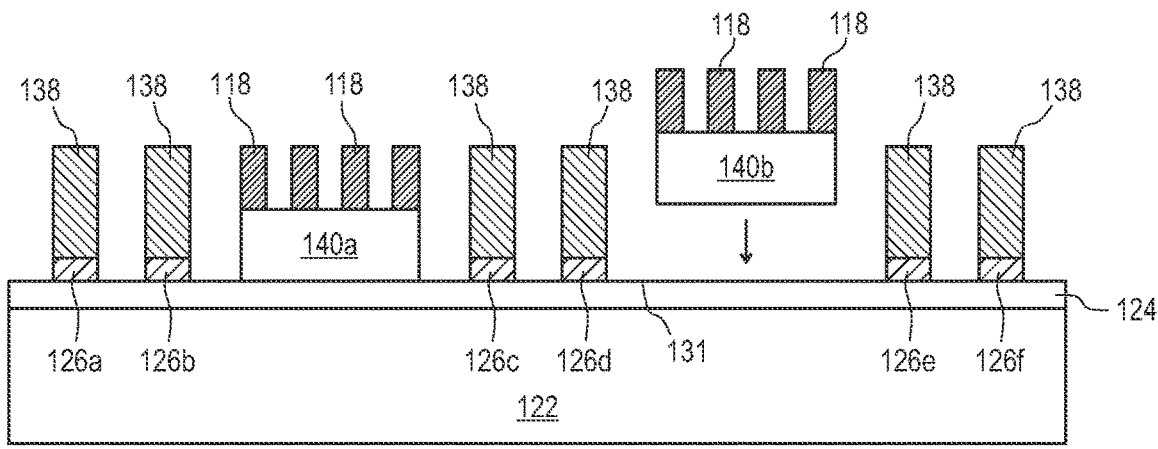
Figure 2I:
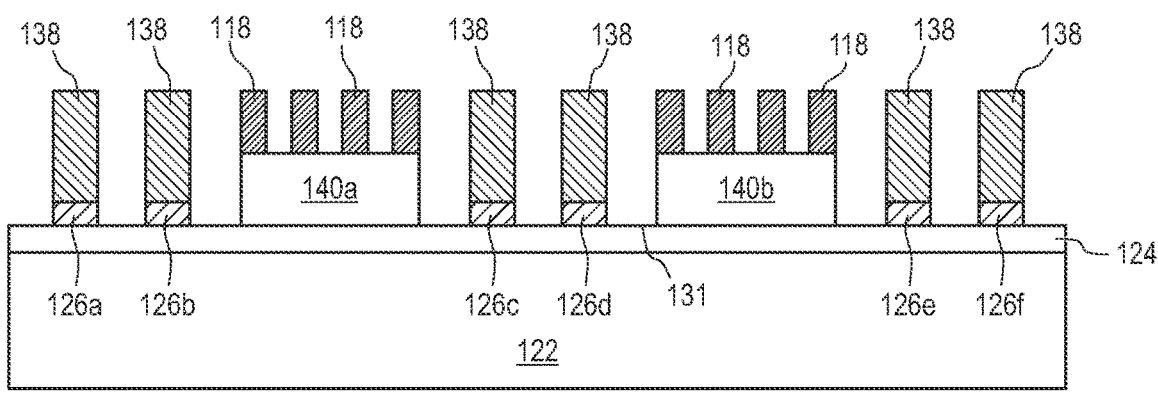
Figure 2J:
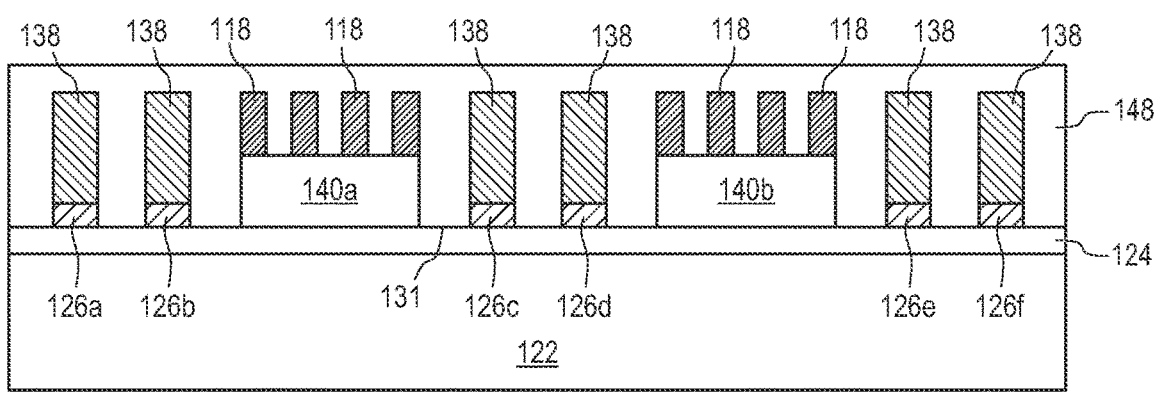
Figure 2K:
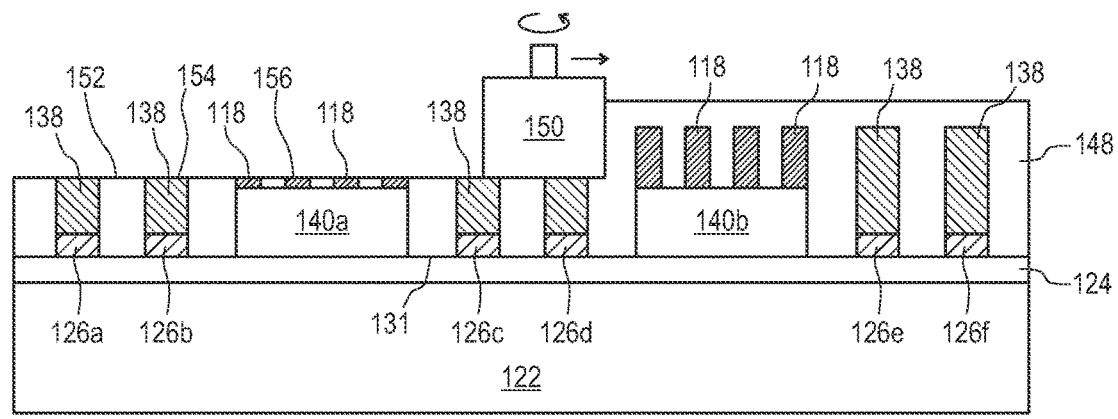
Figure 2L:
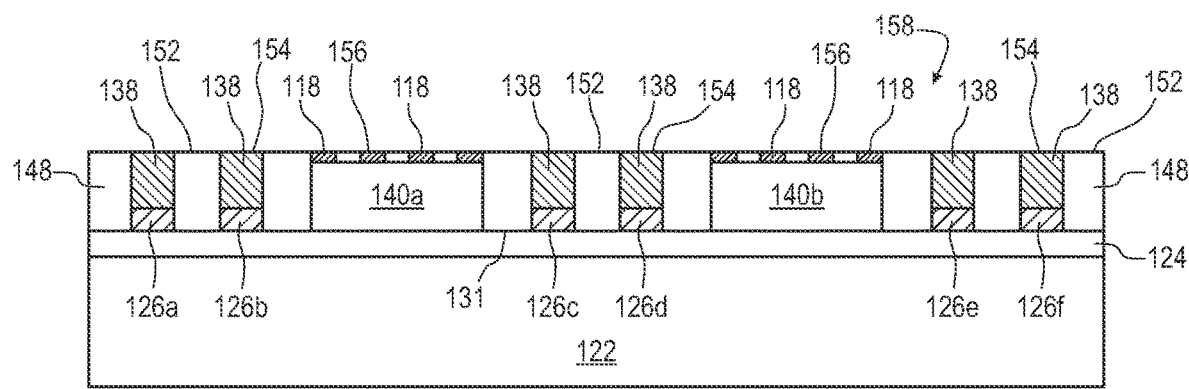
Figure 2M:
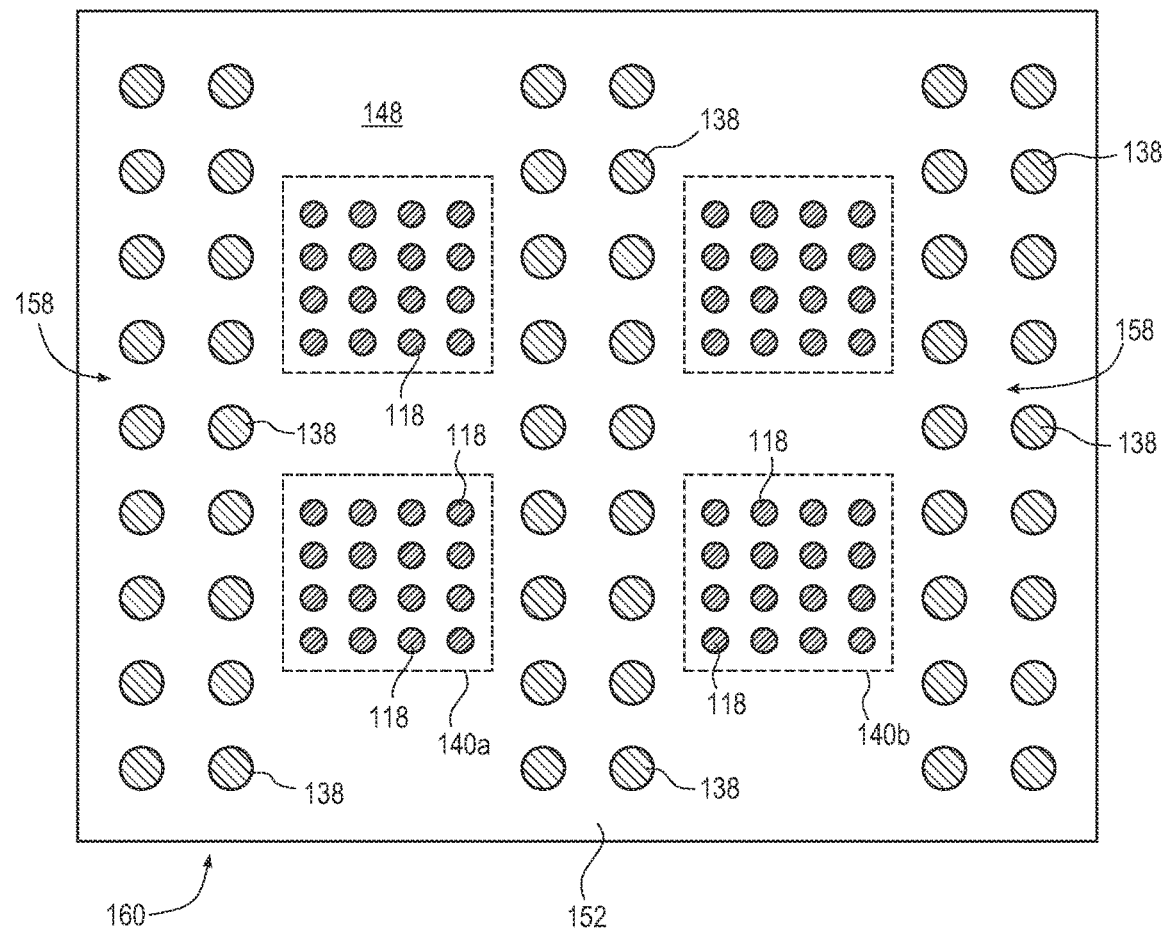
Figure 2N:
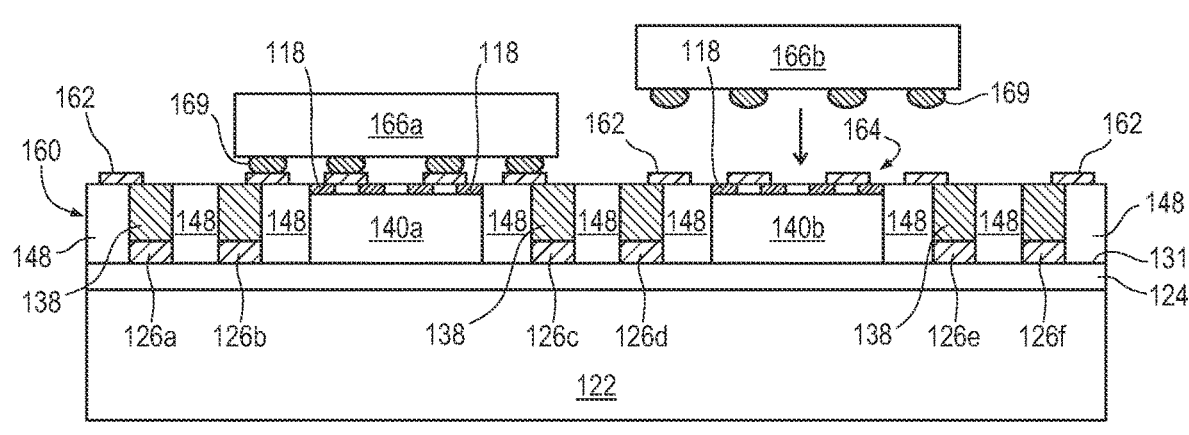
Figure 2O:
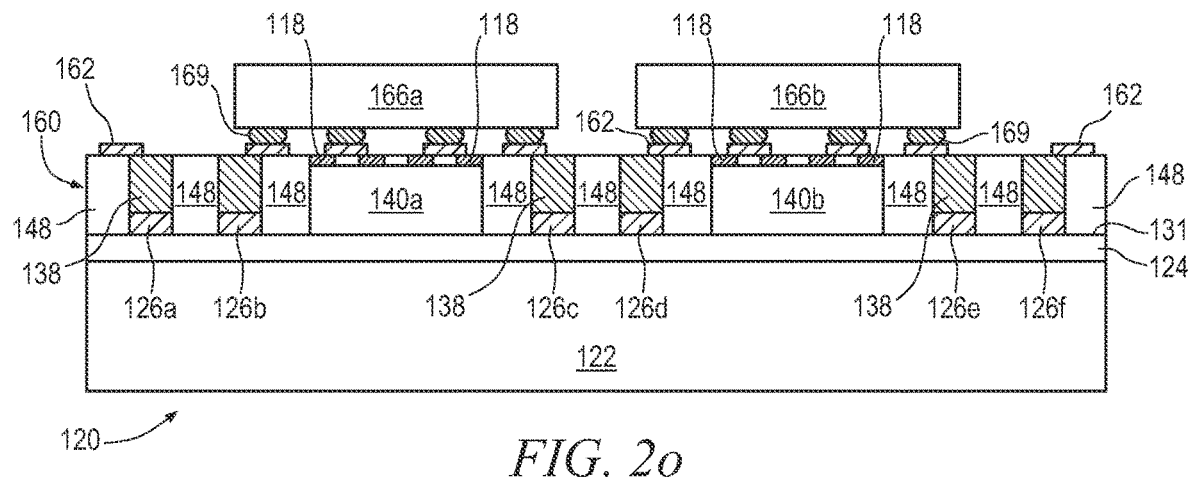
Figure 2P:
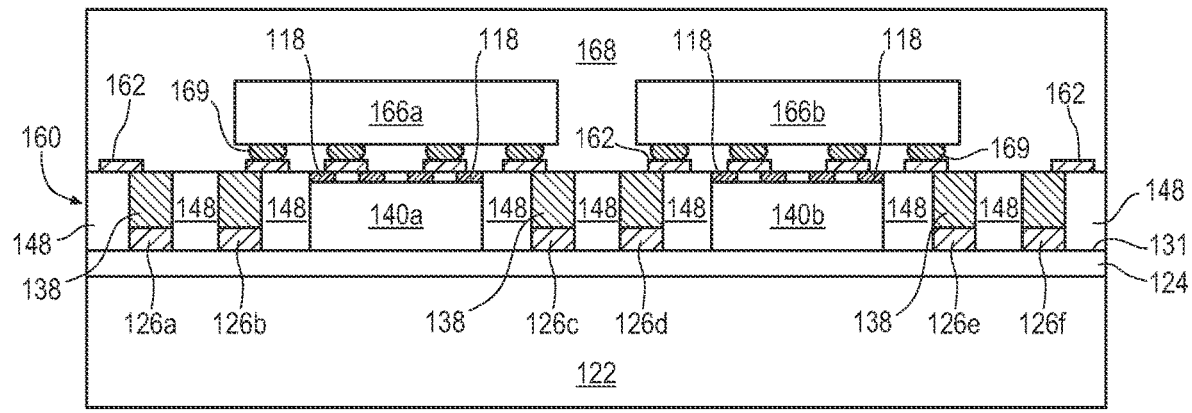
Figure 2Q:
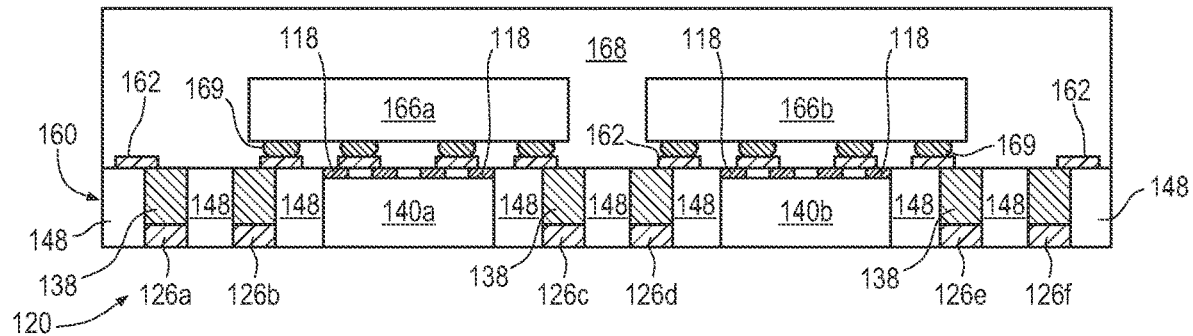
Figure 2R:
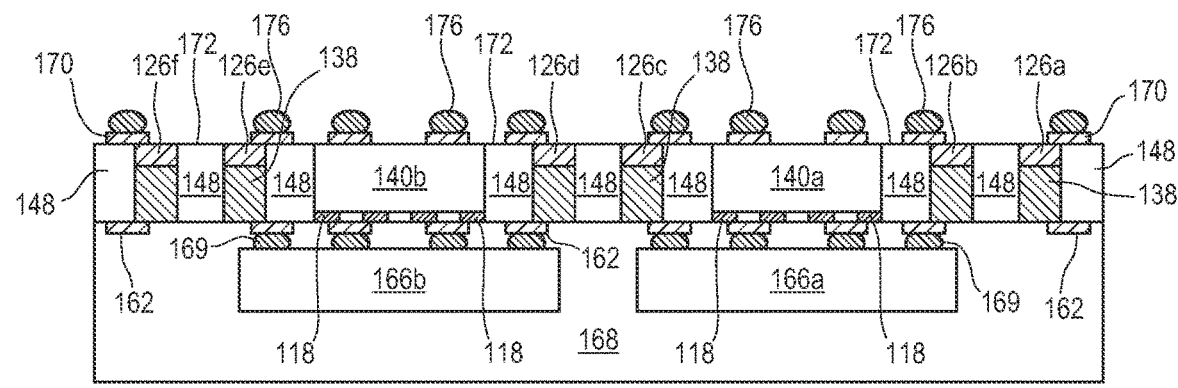
Figure 2S:
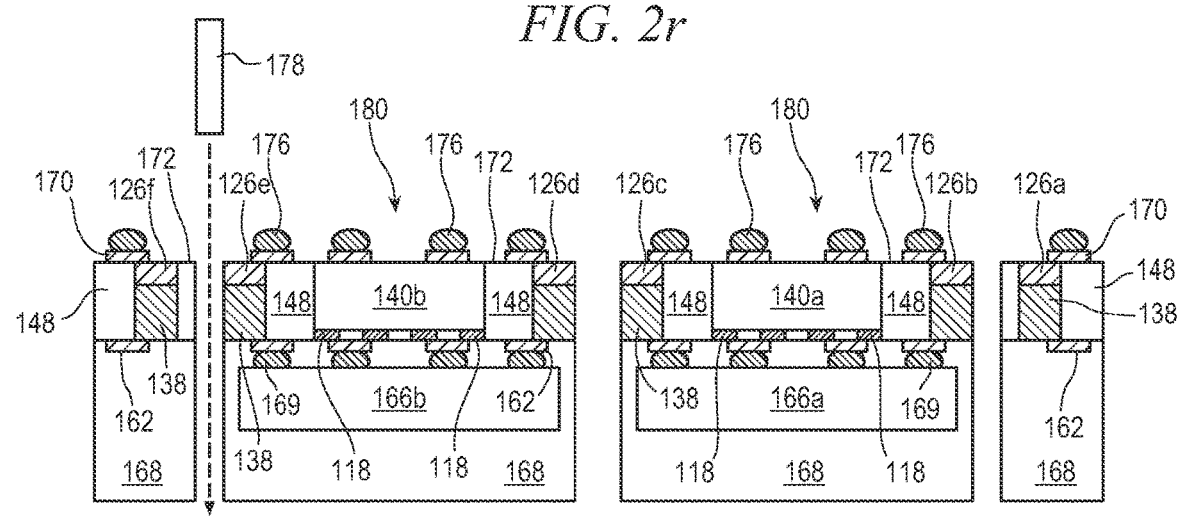

FIGS. 2a-2s illustrate a process of forming a vertical interconnect structure without etching, drilling, or LDA. Elements having a similar function are assigned the same reference number. FIG. 2a shows a cross-sectional view of substrate 120 including base layer 122, release layer 124, and seed layer 126. Base layer 122 can be a semiconductor wafer, woven glass, matte glass, polytetrafluoroethylene (PTFE) pre-impregnated (prepreg), FR-4, FR-1, CEM-1, or CEM-3 with a combination of phenolic cotton paper, epoxy, resin, polyester, and other reinforcement fibers or fabrics. Seed layer 126 is formed over release layer 124 using PVD, CVD, electrolytic plating, electroless plating process, or other suitable metal deposition process. Release layer 124 provides for later separation of base layer 122 from seed layer 126 without damage to the components. Seed layer 126 can be one or more layers of Al, Cu, Sn, Ni, Au, Ag, or other suitable electrically conductive material.

In FIG. 2b, a portion of seed layer 126 is removed by a patterning and etching process to leave electrical contacts 126a-126f. Electrical contacts 126a-126f are arranged in a layout pattern according to the electrical function of the semiconductor device. For example, FIG. 2c shows a top view of electric circuit pattern 128 for electrical contacts 126a-126f.

In FIG. 2d, light sensitive material 130 is deposited over surface 131 of release layer 124 and electrical contacts 126a-126f. In one embodiment, light sensitive material 130 is a photoresist layer. Photoresist layer 130 is patterned to form vias or openings 132. In one embodiment, mask 135 is disposed over photoresist layer 130. Mask 135 and the exposed areas of photoresist layer 130 are exposed to ultraviolet light 133. Areas 134 of photoresist layer 130 exposed to the UV light harden, while areas 136 under mask 135 remain soluble. In FIG. 2e, mask 135 is removed and areas 136 of photoresist layer 130 are rinsed away leaving vias 132. Vias 132 are thus formed without etching, drilling, or LDA. Vias 132 are aligned with and extend to electrical contacts 126a-126f.

In FIG. 2f, vias 132 are filled with a conductive material to form conductive posts 138 over electrical contacts 126a-126f. In one embodiment, conductive posts 138 are formed over electrical contacts 126a-126f using PVD, CVD, electrolytic plating, electroless plating process, or other suitable metal deposition process. In FIG. 2g, photoresist layer 130 is removed leaving conductive posts 138.

In FIG. 2h, a plurality of electrical components 140a-140b is mounted to surface 131 of release layer 122 between conductive posts 138. Electrical components 140a-140b are each positioned over substrate 120 using a pick and place operation. Electrical components 140a-140b each have conductive posts 118 formed without etching, drilling, or LDA. Conductive posts 118 can be used for vertical electrical interconnect. For example, electrical components 140a and 140b can be semiconductor die 104 with conductive posts 118 from FIG. 1f with active surface 108 oriented away from surface 131 of release layer 124. Alternatively, electrical components 140a-140b can include a semiconductor package, semiconductor die, surface mount device, discrete electrical device, discrete transistor, diode, or IPD. FIG. 2i shows electrical components 140a-140b with conductive posts 118 mounted to surface 131 of release layer 124 between conductive posts 138. Conductive posts 138 have a similar electric circuit pattern 128 in FIG. 2c as each is formed over electric contacts 126a-126f.

In FIG. 2j, an encapsulant 148 is deposited over electrical components 140a-140d, conductive posts 138 and 118, and release layer 124. Encapsulant 148 can be polymer composite material, such as epoxy resin with filler, epoxy acrylate with filler, or polymer with proper filler. Encapsulant 148 is non-conductive, provides structural support, and environmentally protects the semiconductor device from external elements and contaminants.

In FIG. 2k, a portion of encapsulant 148 and conductive posts 138 and 118 are removed by grinder 150 to planarize surface 152 of the encapsulant and expose surface 154 of conductive posts 138 and surface 156 of conductive posts 118. Alternatively, a portion of encapsulant 148 and conductive posts 138 and 118 are removed by chemical etching, chemical mechanical polishing (CMP), mechanical peel-off, mechanical grinding, thermal bake, ultra-violet (UV) light, or wet stripping to planarize surface 152 of the encapsulant and expose surface 154 of conductive posts 138 and surface 156 of conductive posts 118. FIG. 2l shows semiconductor component assembly 160 post-grinding with electrical circuit pattern 158, including conductive posts 138 and conductive posts 118, exposed from surface 152 of encapsulant 148. FIG. 2m is a top view of semiconductor component assembly 160 post-grinding with electrical circuit pattern 158, including conductive posts 138 and conductive posts 118, exposed from surface 152 of encapsulant 148.

In FIG. 2n, an electrically conductive layer 162 is patterned and formed over surface 152 of encapsulant 148 using PVD, CVD, electrolytic plating, electroless plating process, or other suitable metal deposition process. Conductive layer 162 can be one or more layers of Al, Cu, Sn, Ni, Au, Ag, or other suitable electrically conductive material. Conductive layer 162 is electrically connected to conductive posts 138 and 118 and provides a second level electric circuit pattern 164 to provide additional electrical interconnect for semiconductor component assembly 160.

A plurality of electrical components 166a-166b is mounted to conductive layer 162 over surface 152 of encapsulant 148 and conductive posts 118 and 138. Electrical components 166a-166b are each positioned over substrate 120 using a pick and place operation. For example, electrical components 166a and 166b can be semiconductor die made similar to semiconductor die 104 from FIG. 1a with bumps 169 instead of conductive posts and possibly a different electrical function. A plurality of bumps 169 is formed on the active surface of the semiconductor die. The semiconductor die are disposed over semiconductor component assembly 160 with bumps 169 oriented toward conductive layer 162. Bumps 169 make mechanical and electrical connection with conductive layer 162 using a reflow process. Alternatively, electrical components 166a-166b can be semiconductor packages, surface mount devices, discrete electrical devices, discrete transistors, diodes, or IPDs. FIG. 2o shows electrical components 166a-166b mounted to conductive layer 162 over surface 152 of encapsulant 148 and conductive posts 118 and 138.

In FIG. 2p, an encapsulant 168 is deposited over electrical components 166a-166b, conductive layer 162, and encapsulant 148. Encapsulant 168 can be polymer composite material, such as epoxy resin with filler, epoxy acrylate with filler, or polymer with proper filler. Encapsulant 168 is non-conductive, provides structural support, and environmentally protects the semiconductor device from external elements and contaminants.

In FIG. 2q, base layer 122 of substrate 120 is removed by chemical etching, CMP, mechanical peel-off, mechanical grinding, thermal bake, UV light, or wet stripping to expose electrical contacts 126a-126f. Release layer 124 allows for separation of base layer 122 without damage to electrical components 140a-140b or electrical contacts 126a-126f.

In FIG. 2r, an electrically conductive layer 170 is patterned and formed over electrical contacts 126a-126f and surface 172 of encapsulant 148 using PVD, CVD, electrolytic plating, electroless plating process, or other suitable metal deposition process. Conductive layer 170 can be one or more layers of Al, Cu, Sn, Ni, Au, Ag, or other suitable electrically conductive material. Conductive layer 170 is electrically connected to conductive posts 138 and 118 and provides additional electrical interconnect for semiconductor component assembly 160.

An electrically conductive bump material is deposited over conductive layer 170 and surface 172 of encapsulant 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 170 using a suitable attachment or bonding process. In one embodiment, the bump material is reflowed by heating the material above its melting point to form balls or bumps 176. In one embodiment, bump 176 is formed over a UBM having a wetting layer, barrier layer, and adhesive layer. Bump 176 can also be compression bonded or thermocompression bonded to conductive layer 170. Bump 176 represents one type of interconnect structure that can be formed over conductive layer 170. The interconnect structure can also use bond wires, conductive paste, stud bump, micro bump, or other electrical interconnect.

Figure 3:
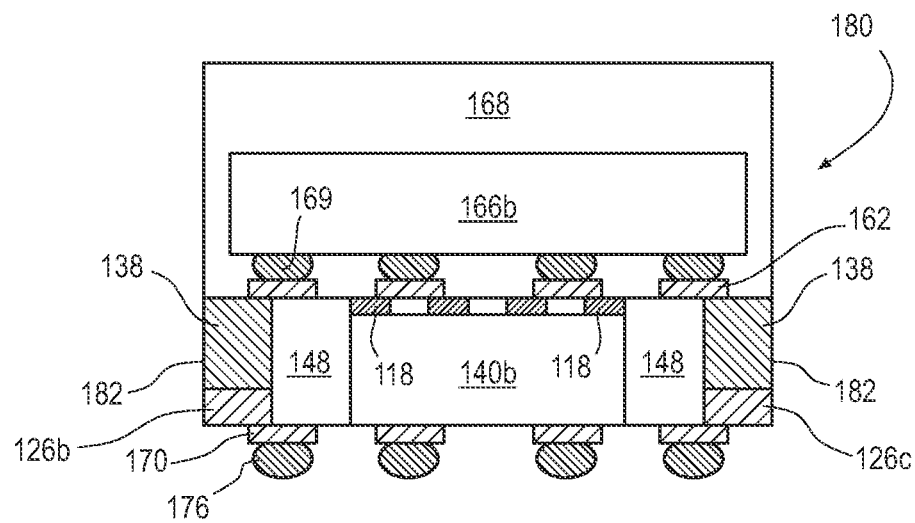
FIG. 3 illustrates the PoP module with vertical interconnect structures from FIGS. 2a-2s.

In FIG. 2s, semiconductor component assembly 160 is singulated through conductive posts 138 using a saw blade or cutting tool 178 into individual PoP or system in package (SIP) modules 180. The individual PoP module 180 can be inspected and electrically tested for identification of KGD post singulation. FIG. 3 shows PoP module 180 post singulation with side surface 182 of conductive posts 138 exposed from the PoP module.

Figure 4:
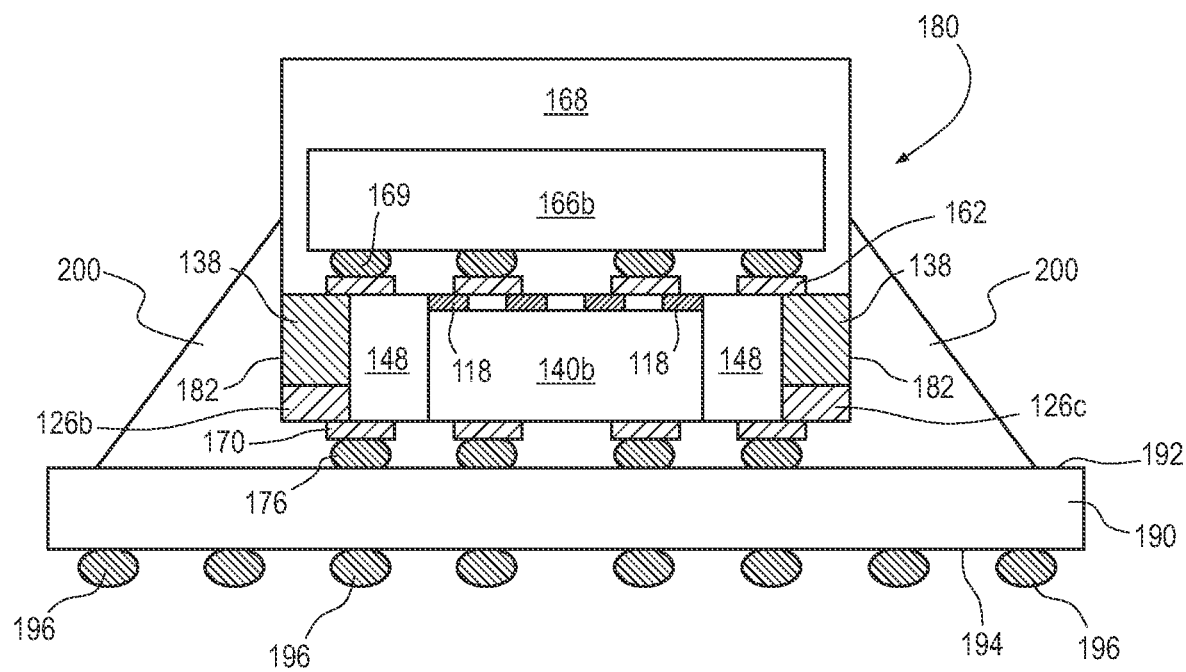
FIG. 4 illustrates the PoP module with underfill material mounted to an interconnect substrate.

In FIG. 4, PoP module 180 is mounted to interconnect substrate 190 including conductive layers and insulating layers (not shown). The conductive layers provide horizontal electrical interconnect across interconnect substrate 190 and vertical electrical interconnect between top surface 192 and bottom surface 194 of substrate 190. Portions of the conductive layers can be electrically common or electrically isolated depending on the design and function of PoP module 180 and other electrical components. The insulating layers in interconnect substrate 190 provide isolation between conductive layers. Bumps 196 are formed on the conductive layer over surface 194. PoP module 180 is mounted to the conductive layer on surface 192. Bumps 176 make mechanical and electrical connection to the conductive layer of interconnect substrate 190. An underfill material 200, such as an epoxy resin, can be deposited under PoP module 180 to cover side surface 182 of conductive posts 138.

The vertical interconnect structure for PoP module 180 is formed by patterning a photoresist layer to form vias. The vias are filled with conductive material to provide conductive posts. These vertical conductive posts are formed without etching, drilling, or LDA to reduce manufacturing costs.

Figure 5:
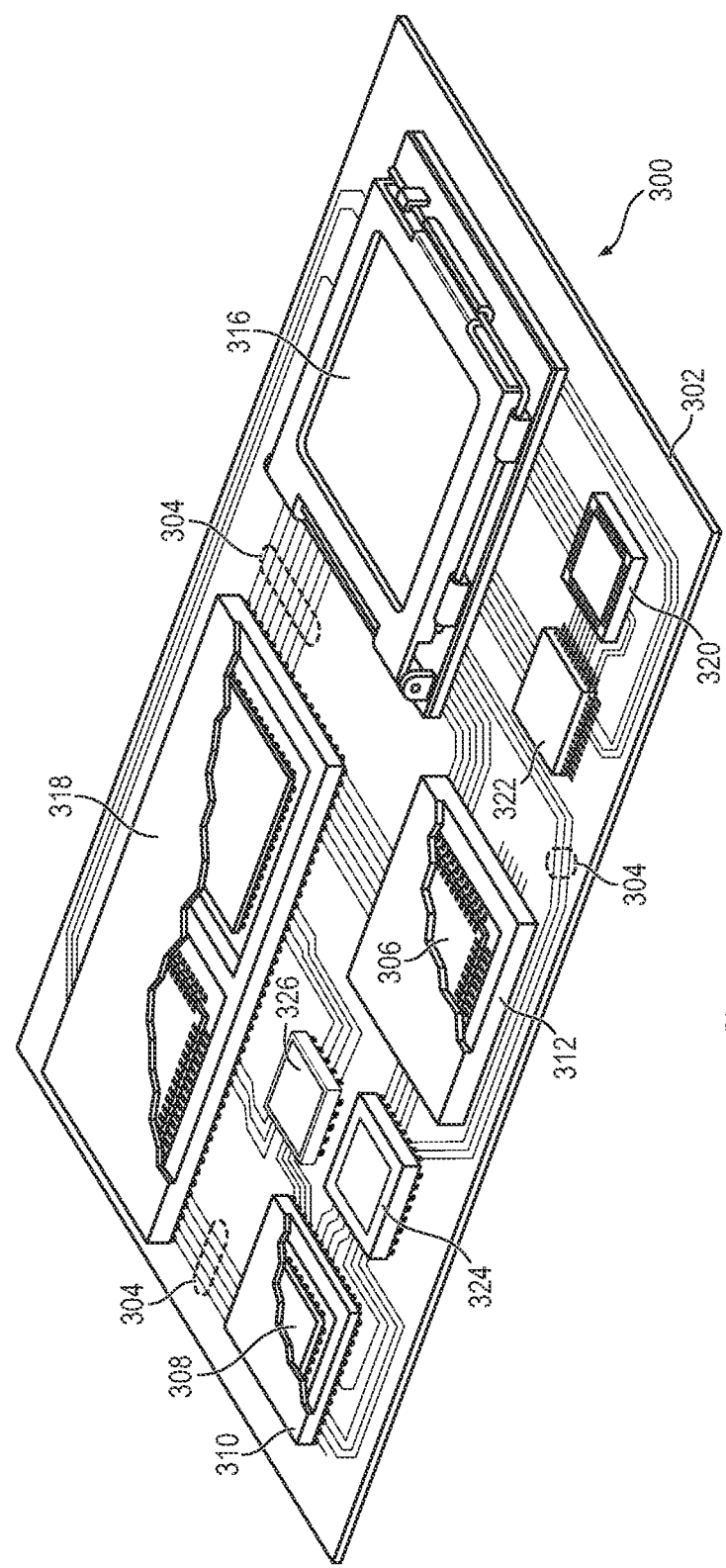
FIG. 5 illustrates a printed circuit board (PCB) with different types of packages mounted to a surface of the PCB.

FIG. 5 illustrates electronic device 300 having a chip carrier substrate or PCB 302 with a plurality of semiconductor packages mounted on a surface of PCB 302, including PoP module 180. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or PoP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first light sensitive material over the substrate;
   forming a plurality of first conductive posts over the substrate by patterning the first light sensitive material and filling the pattern with conductive material;
   disposing a first electrical component over the substrate between the first conductive posts;
   depositing a first encapsulant over the first electrical component and conductive posts;
   removing a portion of the first encapsulant to expose the first conductive posts; and
   singulating through the first conductive posts to expose a side surface of the first conductive posts, wherein the exposed side surface of the first conductive posts extends between a first surface of the first encapsulant and a second surface of the first encapsulant opposite the first surface of the first encapsulant.

2. The method of claim 1, further including forming a plurality of second conductive posts over the first electrical component.

3. The method of claim 2, wherein forming the plurality of second conductive posts includes:
   forming a second light sensitive material over the first electrical component; and
   forming the plurality of second conductive posts over the first electrical component by patterning the second light sensitive material and filling the pattern with conductive material.

4. The method of claim 1, further including disposing a second electrical component over the first electrical component.

5. The method of claim 4, further including disposing a second encapsulant over the second electrical component.

6. A method of making a semiconductor device, comprising:
   providing a substrate;
   forming a plurality of first conductive posts over the substrate by patterning a first light sensitive material and filling the pattern with conductive material;
   disposing a first electrical component over the substrate between the first conductive posts;
   depositing a first encapsulant over the first electrical component and conductive posts; and
   singulating through the first conductive posts to expose a side surface of the first conductive posts, wherein the exposed side surface of the first conductive posts extends between a first surface of the first encapsulant and a second surface of the first encapsulant opposite the first surface of the first encapsulant.

7. The method of claim 6, further including removing a portion of the first encapsulant to expose the first conductive posts.

8. The method of claim 6, further including forming a plurality of second conductive posts over the first electrical component.

9. The method of claim 8, wherein forming the plurality of second conductive posts includes:
   forming a second light sensitive material over the first electrical component; and
   forming the plurality of second conductive posts over the first electrical component by patterning the second light sensitive material and filling the pattern with conductive material.

10. The method of claim 6, further including disposing a second electrical component over the first electrical component.

11. The method of claim 10, further including disposing a second encapsulant over the second electrical component.

12. A method of making a semiconductor device, comprising:
    providing a substrate;
    forming a plurality of first conductive posts over the substrate by patterning a first light sensitive material and filling the pattern with conductive material;
    disposing a first electrical component over the substrate between the first conductive posts;
    depositing a first encapsulant over the first electrical component and conductive posts; and
    singulating through the first conductive posts to expose a side surface of the first conductive posts extending between a first surface of the first encapsulant and a second surface of the first encapsulant opposite the first surface of the first encapsulant.

13. The method of claim 12, further including removing a portion of the first encapsulant to expose the first conductive posts.

14. The method of claim 12, further including forming a plurality of second conductive posts over the first electrical component.

15. The method of claim 14, wherein the plurality of second conductive posts is formed by patterning a second light sensitive material and filling the pattern with conductive material.

16. The method of claim 12, further including disposing a second electrical component over the first electrical component.

17. The method of claim 16, further including depositing a second encapsulant over the second electrical component.

18. A method of making a semiconductor device, comprising:
    providing a substrate;
    forming a first light sensitive material over the substrate;

forming a plurality of first conductive posts over the substrate by patterning the first light sensitive material and filling the pattern with conductive material;

disposing a first electrical component over the substrate;

depositing a first encapsulant over the first electrical component and conductive posts; and singulating through the first conductive posts to expose a side surface of the first conductive posts between a first surface of the first encapsulant and a second surface of the first encapsulant opposite the first surface of the first encapsulant.

19. The method of claim 18, further including
removing a portion of the first encapsulant to expose the first conductive posts.

20. The method of claim 18, further including forming a plurality of second conductive posts over the first electrical component.

21. The method of claim 20, wherein the plurality of second conductive posts is formed by patterning a second light sensitive material and filling the pattern with conductive material.

22. The method of claim 18, further including disposing a second electrical component over the first electrical component.

23. The semiconductor device of claim 22, further including depositing a second encapsulant over the second electrical component.

\* \* \* \* \*